United States Patent
Masuta

(10) Patent No.: US 10,054,125 B2
(45) Date of Patent: Aug. 21, 2018

(54) CROSS-FLOW FAN, ELECTRONIC DEVICE, AND IMPELLER

(71) Applicant: KYOCERA Document Solutions Inc., Osaka-shi, Osaka (JP)

(72) Inventor: Noriko Masuta, Osaka (JP)

(73) Assignee: KYOCERA Document Solutions Inc., Osaka-shi, Osaka (JP)

( * ) Notice: Subject to any disclaimer, the term of this patent is extended or adjusted under 35 U.S.C. 154(b) by 0 days.

(21) Appl. No.: 15/128,899

(22) PCT Filed: Feb. 17, 2015

(86) PCT No.: PCT/JP2015/054256
§ 371 (c)(1),
(2) Date: Sep. 23, 2016

(87) PCT Pub. No.: WO2015/146371
PCT Pub. Date: Oct. 1, 2015

(65) Prior Publication Data
US 2017/0112019 A1    Apr. 20, 2017

(30) Foreign Application Priority Data

Mar. 25, 2014 (JP) ................................ 2014-062499

(51) Int. Cl.
*F04D 17/04* (2006.01)
*H05K 7/20* (2006.01)
(Continued)

(52) U.S. Cl.
CPC ............. *F04D 17/04* (2013.01); *F04D 17/16* (2013.01); *F04D 29/282* (2013.01);
(Continued)

(58) Field of Classification Search
CPC ........................................................ F04D 17/04
See application file for complete search history.

(56) References Cited

U.S. PATENT DOCUMENTS 3,147,368 A * 9/1964 Walker .................... F04D 17/04
165/122
3,250,457 A * 5/1966 Walker .................... F04D 17/04
392/379

(Continued)

FOREIGN PATENT DOCUMENTS

CN          1056737 A      12/1991
JP          H0517198 U  *  3/1993  ............. F04D 17/04
(Continued)

*Primary Examiner* — Robert J Hoffberg
(74) *Attorney, Agent, or Firm* — Alleman Hall Creasman & Tuttle LLP

(57) ABSTRACT

A cross-flow fan includes a shaft, a plurality of impellers, and a regulation portion. Each impeller has: an opening into which the shaft is inserted; fitting portions provided at a first end portion and a second end portion in an axial direction of the shaft such that the fitting portions at the first end portion and the fitting portions at the second end portion are fittable into each other; and a blade portion provided between the first end portion and the second end portion. The regulation portion is configured to regulate movement, in the axial direction, of each of the plurality of impellers connected in the axial direction by the shaft being inserted into the opening and the fitting portions being provided, the regulation portion regulating the movement of each impeller on both ends, in the axial direction, of the plurality of impellers. Thus, assembling process is simplified.

2 Claims, 6 Drawing Sheets

(51) Int. Cl.
*F04D 17/16* (2006.01)
*F04D 29/28* (2006.01)

(52) U.S. Cl.
CPC ....... *F04D 29/287* (2013.01); *H05K 7/20136* (2013.01); *H05K 7/20145* (2013.01); *H05K 7/20172* (2013.01)

(56) References Cited

U.S. PATENT DOCUMENTS

| | | | | |
|---|---|---|---|---|
| 4,436,484 A | * | 3/1984 | Temple | F04D 29/283 416/178 |
| 4,859,888 A | * | 8/1989 | Ohbayashi | F04D 17/04 310/264 |
| 5,428,945 A | * | 7/1995 | von Allworden | A01F 12/444 460/98 |
| 5,599,162 A | * | 2/1997 | Ricketts | A01F 12/444 415/53.1 |
| 6,953,322 B2 | * | 10/2005 | Lim | F04D 17/04 415/127 |
| 8,007,225 B2 | * | 8/2011 | Ko | F04D 29/668 415/119 |
| 8,052,374 B2 | * | 11/2011 | Ricketts | A01F 12/444 415/203 |
| 8,092,181 B2 | * | 1/2012 | Nishino | F04D 17/04 29/889.4 |
| 9,447,790 B2 | * | 9/2016 | Nakai | F04D 17/04 |
| 9,562,535 B2 | * | 2/2017 | Masuta | F04D 17/04 |
| 9,651,917 B2 | * | 5/2017 | Masuta | G03G 21/206 |
| 2001/0033593 A1 | * | 10/2001 | Minobe | H01S 3/036 372/58 |
| 2007/0212211 A1 | * | 9/2007 | Chiyoda | F04D 17/04 415/53.1 |
| 2010/0158689 A1 | * | 6/2010 | Nishino | F04D 17/04 416/213 A |
| 2014/0369808 A1 | * | 12/2014 | Chen | F04D 17/04 415/60 |
| 2015/0024675 A1 | * | 1/2015 | Hu | F24F 7/007 454/258 |

FOREIGN PATENT DOCUMENTS

| | | | |
|---|---|---|---|
| JP | 2002048086 A | * 2/2002 | |
| JP | 2002130181 A | * 5/2002 | |
| JP | 2002266788 A | 9/2002 | |
| JP | 2005127208 A | * 5/2005 | F04D 17/04 |
| WO | 2012147182 A1 | 11/2012 | |

* cited by examiner

CROSS-FLOW FAN, ELECTRONIC DEVICE, AND IMPELLER

TECHNICAL FIELD

The present invention relates to cross-flow fans, electronic devices that include cross-flow fans, and impellers for cross-flow fans.

BACKGROUND ART

Cooling is performed by using a cross-flow fan in order to, for example, inhibit increase of internal temperature in an electronic device such as an image forming apparatus in some cases. For example, such a cross-flow fan is formed and manufactured so as to be elongated in the axial direction by a plurality of impellers being welded.

However, a problem arises that, in a case where the cross-flow fan is manufactured by a plurality of impellers being welded, facilities for the welding are necessary and cost is increased. Meanwhile, a cross-flow fan manufactured by a plurality of impellers being fixed to a shaft by locking members is known as a related art (for example, see Patent Literature 1).

CITATION LIST

Patent Literature

[PTL 1] WO2012/147182

SUMMARY OF THE INVENTION

Problems to be Solved by the Invention

However, in a case where a plurality of impellers are fixed to a shaft by locking members as in the related art, a bothersome fixing operation needs to be performed. Therefore, a problem arises that, for example, a lot of time is required for an assembling process.

An object of the present invention is to provide a cross-flow fan, an electronic device, and an impeller that allow an assembling process to be simplified.

Solution to the Problems

A cross-flow fan according to one aspect of the present invention includes: a shaft, a plurality of impellers, and a regulation portion. Each impeller has an opening into which the shaft is inserted, has fitting portions provided at a first end portion and a second end portion in an axial direction of the shaft such that, in the plurality of impellers, the fitting portions at the first end portion and the fitting portions at the second end portion are fittable into each other, and has a blade portion provided between the first end portion and the second end portion. The regulation portion is configured to regulate movement, in the axial direction, of each of the plurality of impellers connected in the axial direction by the shaft being inserted into the opening and the fitting portions being provided, the regulation portion regulating the movement of each impeller on both ends, in the axial direction, of the plurality of impellers.

An electronic device according to another aspect of the present invention includes the cross-flow fan and a driving portion.

An impeller according to another aspect of the present invention includes an opening, fitting portions, and a blade portion. Into the opening, a shaft is inserted. The fitting portions are provided at a first end portion and a second end portion in an axial direction of the shaft such that the fitting portions at the first end portion and the fitting portions at the second end portion are fittable into each other. The blade portion is provided between the first end portion and the second end portion.

Advantageous Effects of the Invention

According to the present invention, a cross-flow fan, an electronic device, and an impeller that allow an assembling process to be simplified, can be provided.

DESCRIPTION OF EMBODIMENTS

Hereinafter, an embodiment of the present invention will be described with reference to the accompanying drawings to allow the understanding of the present invention. The embodiment described below is merely an embodied example of the present invention, and, by nature, do not limit the technical scope of the present invention.

[Schematic Structure of Image Forming Apparatus 10]

Figure 1:
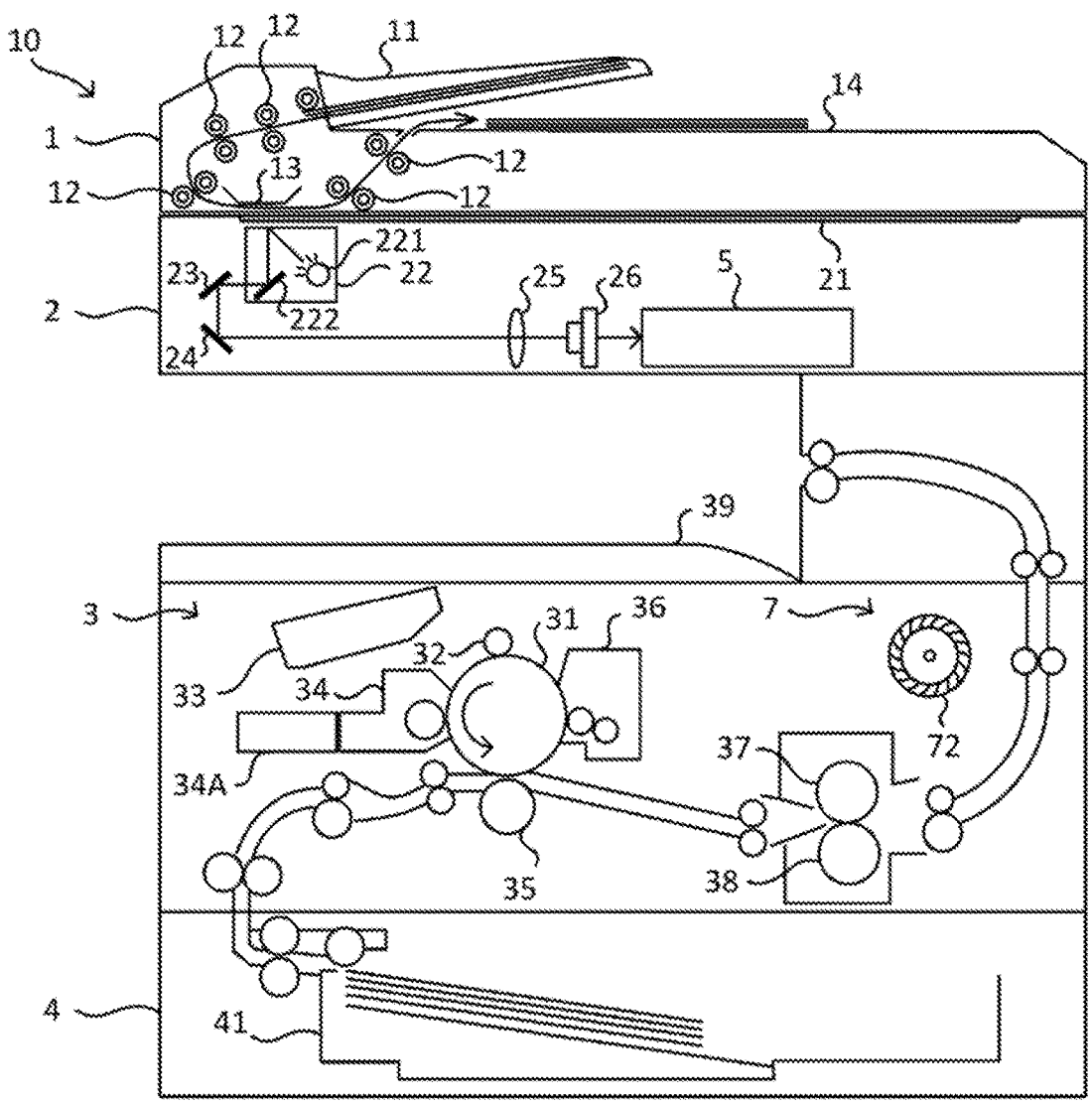
FIG. 1 illustrates a structure of an image forming apparatus according to an embodiment of the present invention.
Figure 2:
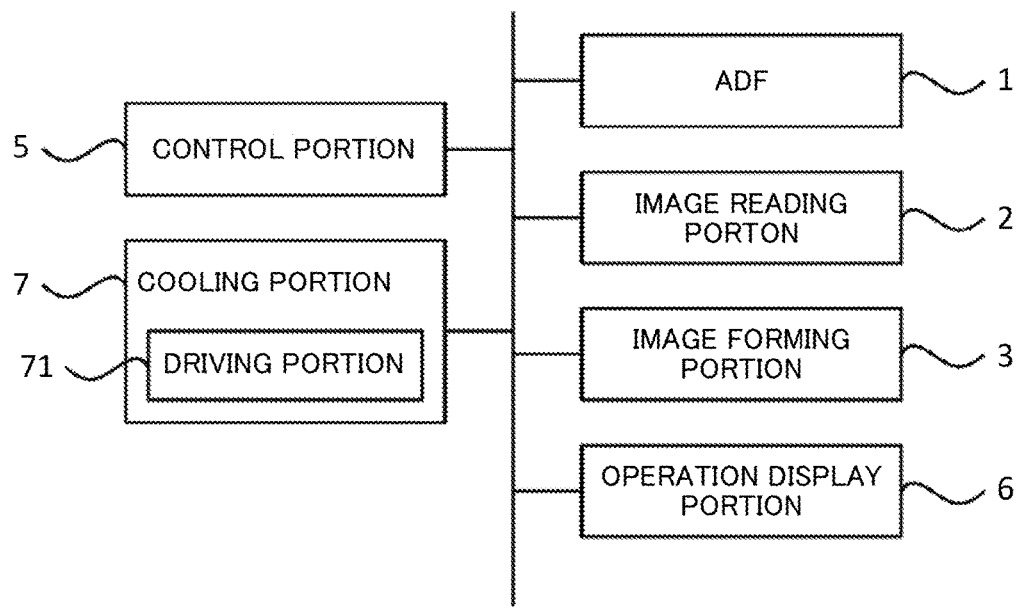
FIG. 2 is a block diagram illustrating a system configuration of the image forming apparatus according to the embodiment of the present invention.

As shown in FIG. 1 and FIG. 2, an image forming apparatus 10 according to an embodiment of the present invention includes an ADF 1, an image reading portion 2, an image forming portion 3, a sheet feed portion 4, a control portion 5, an operation display portion 6, a cooling portion 7, and the like. In the description herein, the device that includes the cooling portion 7 is an example of an electronic device according to the present invention. The present invention is also applicable to an image reading apparatus or an image forming apparatus such as a scanner, a printer apparatus, a facsimile apparatus, and a copying machine.

Further, the present invention is also applicable to various home electric appliances such as air conditioners, refrigerators, and microwave ovens.

The ADF 1 is an automatic document feeder that includes a document set portion 11, a plurality of conveying rollers 12, a document holder 13, and a sheet discharge portion 14, as shown in FIG. 1. In the ADF 1, each conveying roller 12 is driven by a not-illustrated motor, whereby a document placed on the document set portion 11 passes through a reading position at which image data is read by the image reading portion 2, and is conveyed to the sheet discharge portion 14. Thus, the image reading portion 2 is capable of reading image data from the document fed by the ADF 1.

The image reading portion 2 includes a document table 21, a reading unit 22, a mirror 23, a mirror 24, an optical lens 25, and a CCD (Charge Coupled Device) 26, as shown in FIG. 1. The reading unit 22 includes a LED light source 221 and a mirror 222.

The image forming portion 3 includes a photosensitive drum 31, a charging device 32, a laser scanning unit (LSU) 33, a developing device 34, a transfer roller 35, a cleaning device 36, a fixing roller 37, a pressure roller 38, and a sheet discharge tray 39, as shown in FIG. 1. In the image forming portion 3, an image is formed, based on the image data, on a sheet supplied from a sheet feed cassette 41 that is detachably mounted to the sheet feed portion 4, and the sheet on which the image has been formed is discharged onto the sheet discharge tray 39. To the developing device 34, toner (developer) is supplied from a toner container 34A that is detachably mounted to the image forming portion 3.

The operation display portion 6 includes a display portion, such as a liquid crystal panel, on which various information is displayed according to a control instruction from the control portion 5, and an operation portion such as an operation key or a touch panel that allows various information to be inputted to the control portion 5 according to an operation by a user.

Cooling is performed by using a cross-flow fan in order to, for example, inhibit increase of internal temperature in an electronic device such as the image forming apparatus 10 in some cases. For example, such a cross-flow fan is formed and manufactured so as to be elongated in the axial direction by a plurality of impellers being welded.

A problem arises that, in a case where the cross-flow fan is manufactured by a plurality of impellers being welded, facilities for the welding are necessary and cost is increased. Meanwhile, a cross-flow fan manufactured by a plurality of impellers being fixed to a shaft by locking members is known as a related art.

However, in a case where a plurality of impellers are fixed to a shaft by locking members as in the related art, a problem arises that a bothersome fixing operation needs to be performed and a lot of time is required for an assembling process. Meanwhile, the cross-flow fan used for cooling in the image forming apparatus 10 allows increase of time for the assembling process to be inhibited as described below.

Figure 3:
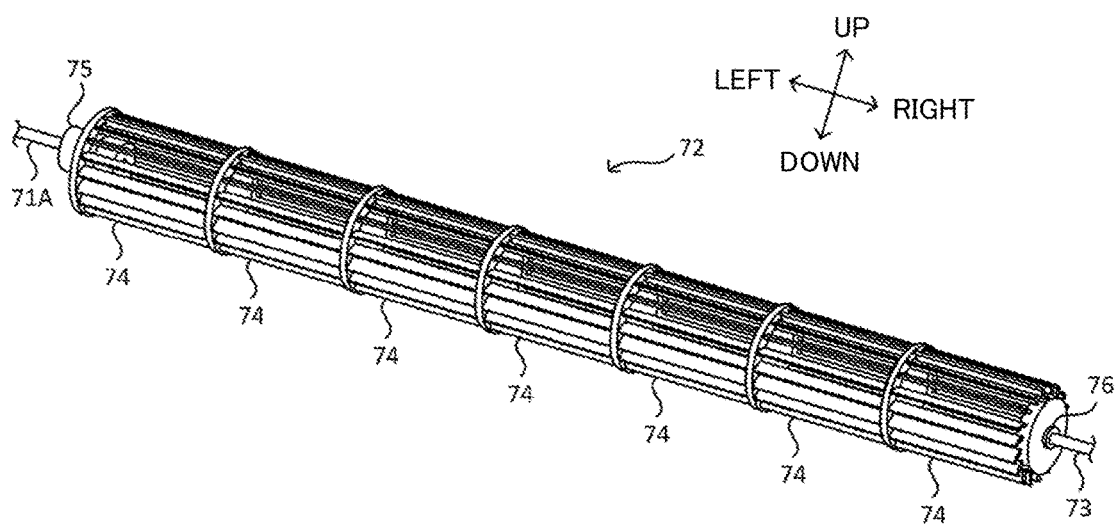
FIG. 3 illustrates a structure of a cross-flow fan of the image forming apparatus according to the embodiment of the present invention.

The cooling portion 7 will be firstly described with reference to FIG. 1 to FIG. 3. FIG. 3 is a perspective view of a cross-flow fan 72. In the following description, for convenience of description, the axial direction of the cross-flow fan 72 may be referred to as the left-right direction as shown in FIG. 3.

The cooling portion 7 performs cooling by blowing air in the image forming apparatus 10. Specifically, the cooling portion 7 is disposed downstream of the fixing roller 37 in the sheet conveying path of the image forming portion 3, as shown in FIG. 1, and cools a sheet heated by the fixing roller 37 by blowing air over a portion in the main scanning direction.

More specifically, the cooling portion 7 includes a driving portion 71 and the cross-flow fan 72, as shown in FIG. 2 and FIG. 3. Further, the cooling portion 7 includes a bearing portion 77 (see FIG. 10).

The driving portion 71 includes a driving source, such as a motor, which generates driving force necessary for rotating the cross-flow fan 72. The driving force generated by the driving portion 71 is transmitted to a drive shaft 71A (see FIG. 3) provided on a first side portion, in the main scanning direction, of a housing of the image forming apparatus 10, via a power transmission mechanism that includes a not-illustrated gear and the like. The bearing portion 77 is provided, at a position opposing the drive shaft 71, on a second side portion, in the main scanning direction, of the housing of the image forming apparatus 10.

Figure 4:
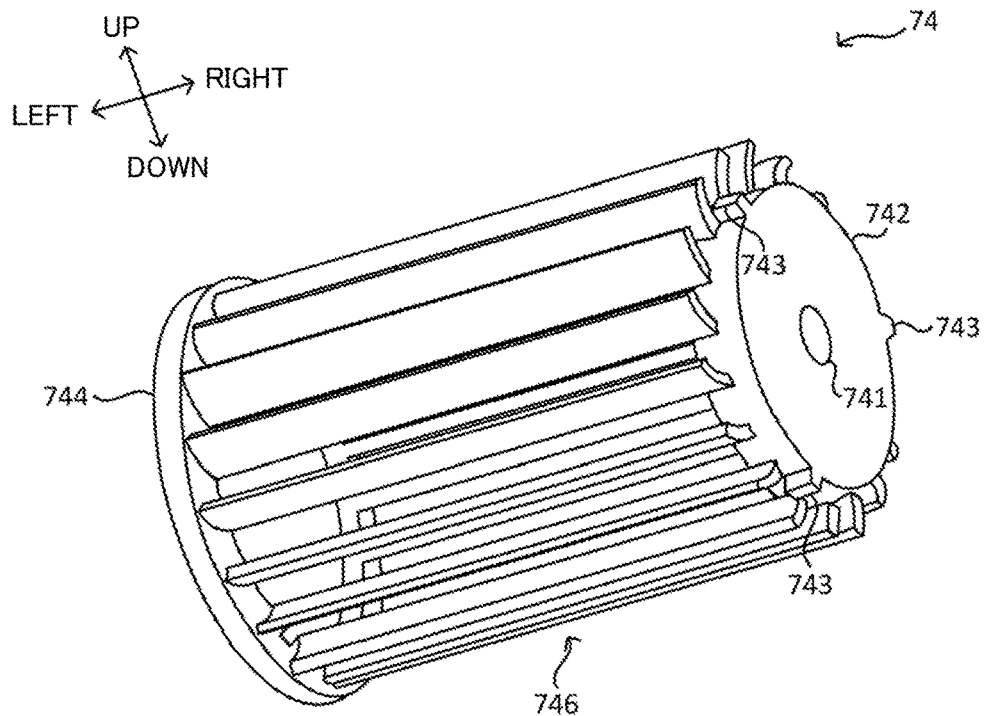
FIG. 4 illustrates a structure of an impeller of the image forming apparatus according to the embodiment of the present invention.
Figure 5:
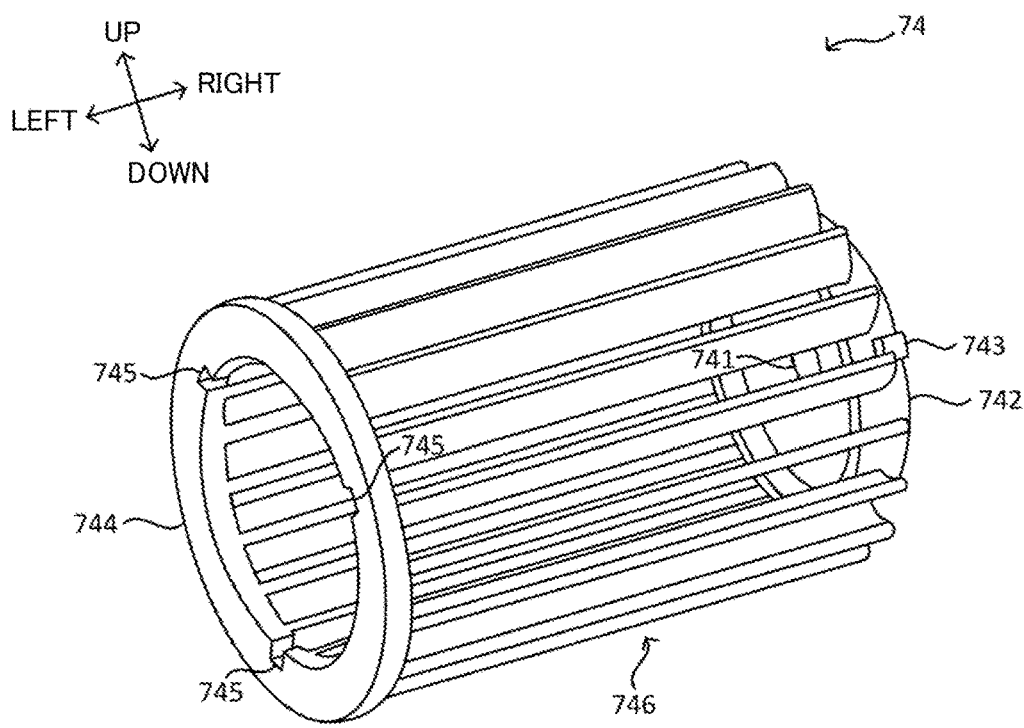
FIG. 5 illustrates a structure of the impeller of the image forming apparatus according to the embodiment of the present invention.
Figure 6:
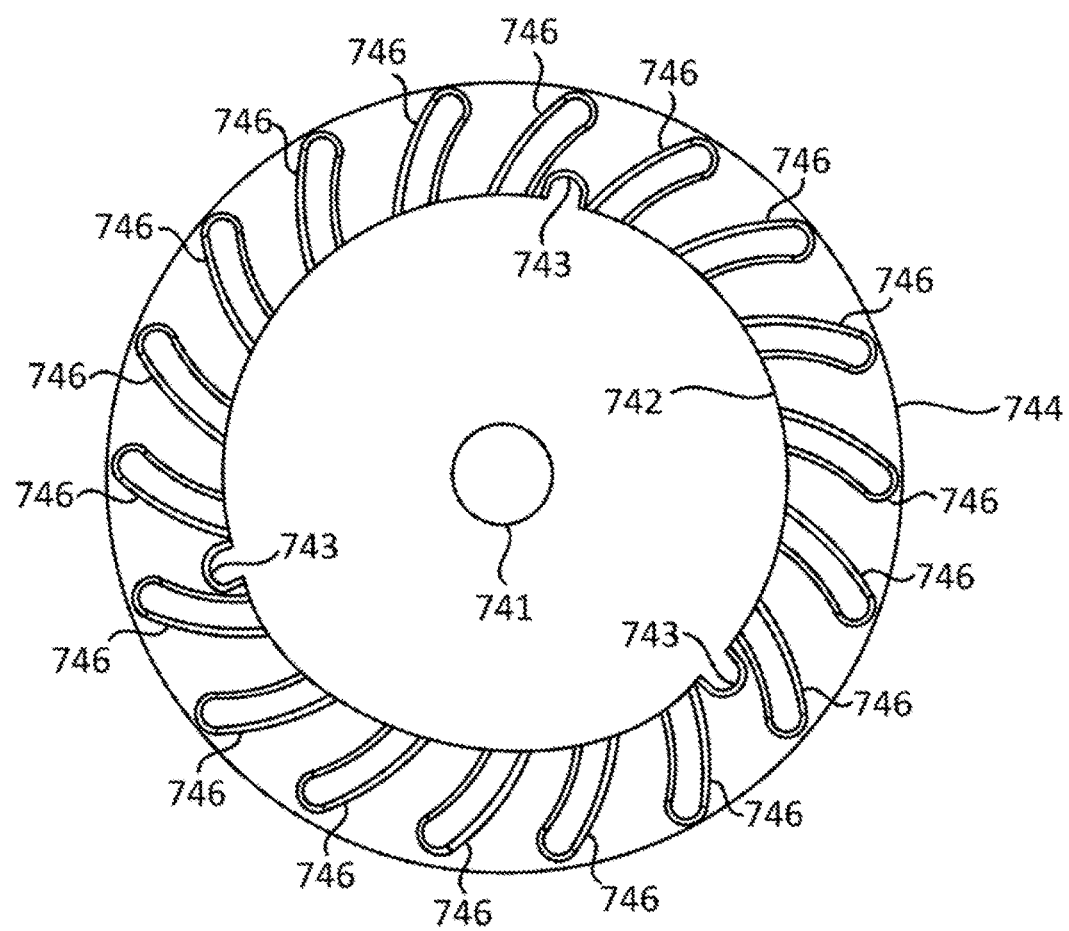
FIG. 6 illustrates a structure of the impeller of the image forming apparatus according to the embodiment of the present invention.
Figure 7:
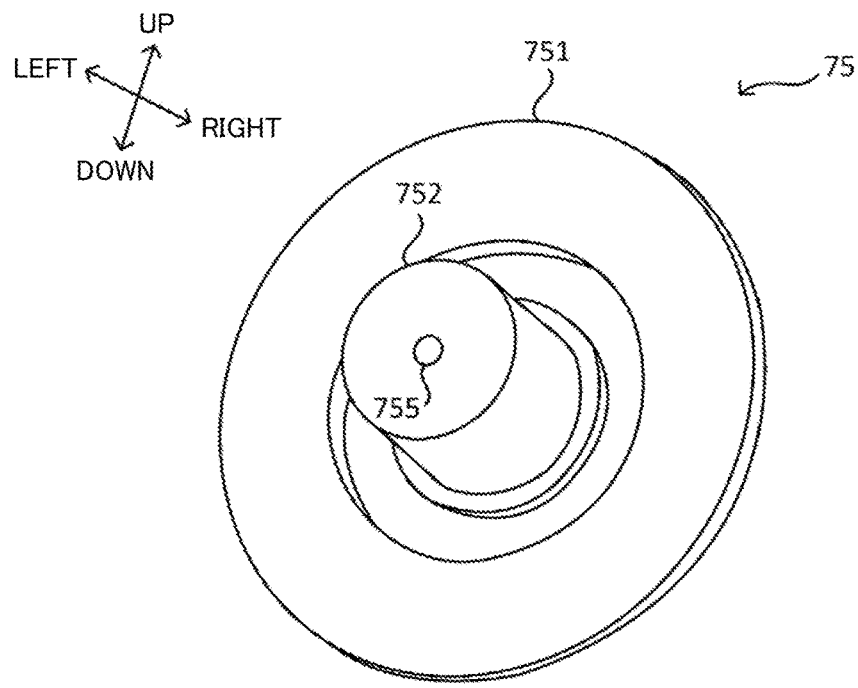
FIG. 7 illustrates a structure of a fixing portion of the image forming apparatus according to the embodiment of the present invention.
Figure 8:
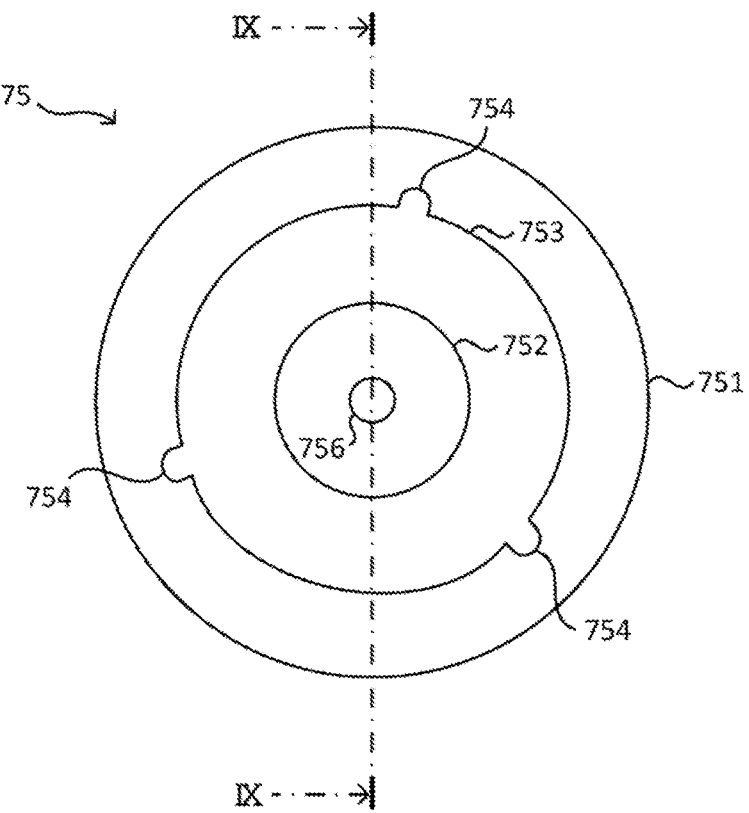
FIG. 8 illustrates a structure of the fixing portion of the image forming apparatus according to the embodiment of the present invention.
Figure 9:
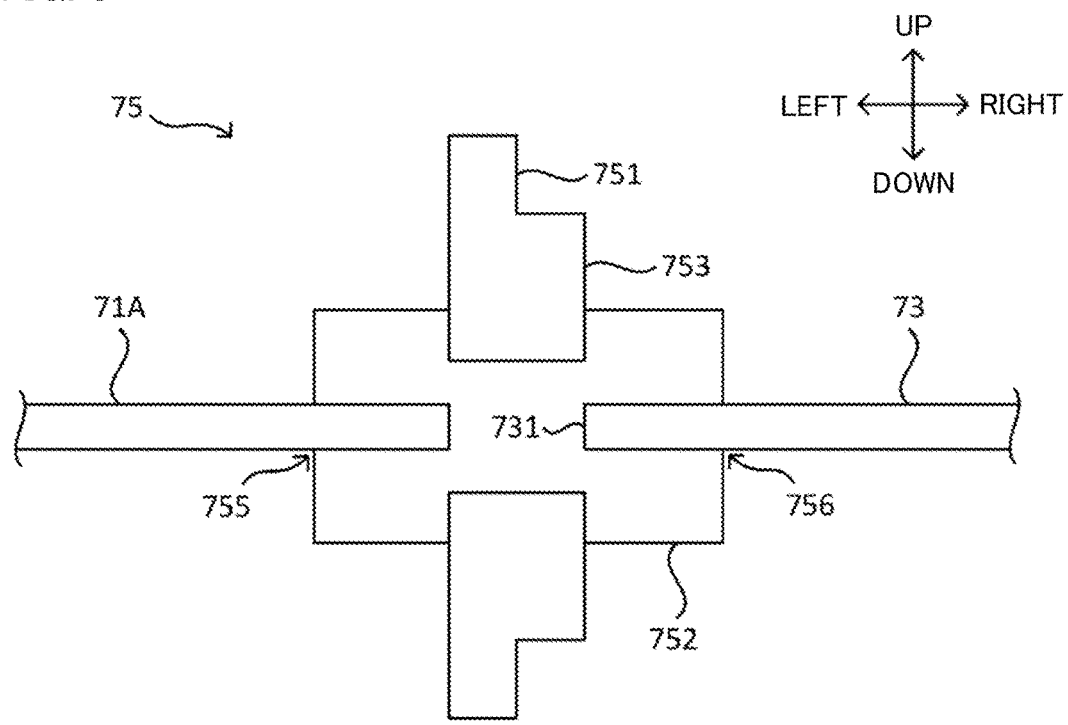
FIG. 9 illustrates a structure of the fixing portion of the image forming apparatus according to the embodiment of the present invention.
Figure 10:
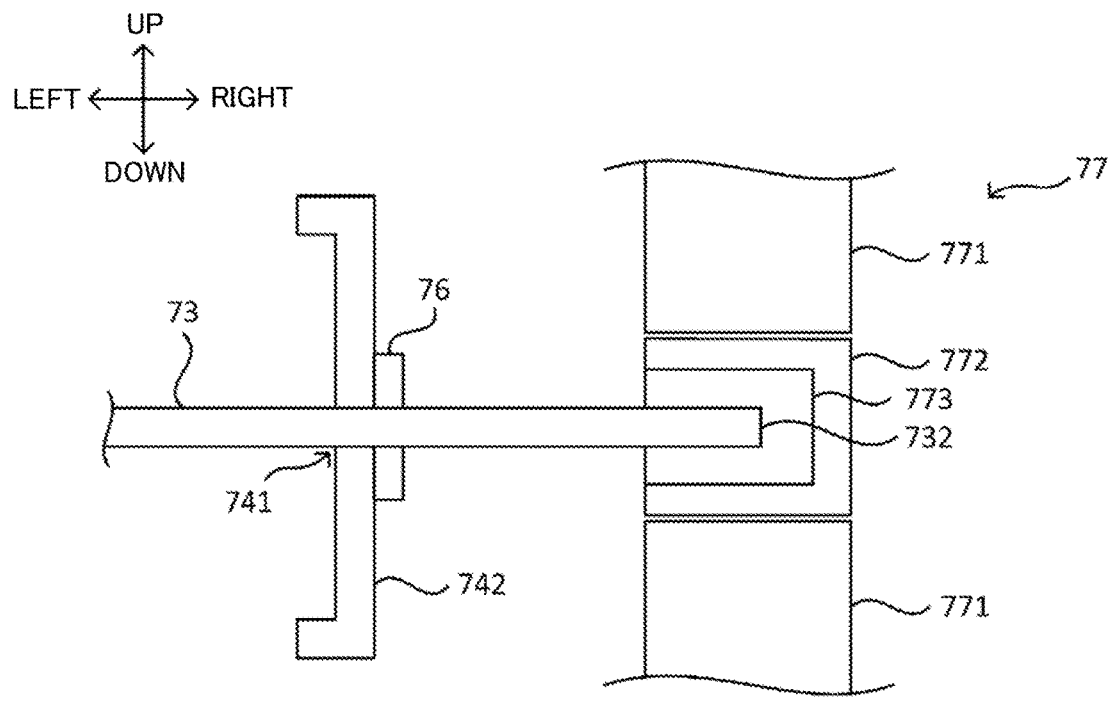
FIG. 10 illustrates a structure of a bearing portion of the image forming apparatus according to the embodiment of the present invention.

Next, the cross-flow fan 72 will be described in detail with reference to FIG. 3 to FIG. 10. FIG. 4 and FIG. 5 are each a perspective view of an impeller 74. FIG. 6 is a right side view of the impeller 74. FIG. 7 is a perspective view of a fixing portion 75. FIG. 8 is a right side view of FIG. 7. FIG. 9 is a schematic sectional view as seen from the direction of arrows IX-IX in FIG. 8. FIG. 10 is a schematic cross-sectional view of the bearing portion 77.

The cross-flow fan 72 is a fan that takes in air from a direction perpendicular to the axial direction and blows air in a direction perpendicular to the axial direction. Specifically, the cross-flow fan 72 includes a plurality of the impellers 74 connected to each other along the axial direction, and has a shaft 73 at the axial center, as shown in FIG. 3. Further, the fixing portion 75 and a locking portion 76 are provided on both end portions, respectively, of the plurality of the impellers 74 connected to each other.

An end portion 731 (see FIG. 9), on the left side in the left-right direction in FIG. 3, of the shaft 73 is connected to the drive shaft 71A, and an end portion 732 (see FIG. 10), on the right side in the left-right direction, of the shaft 73 is supported by the bearing portion 77 so as to be rotatable. That is, in the image forming apparatus 10, the cross-flow fan 72 is positioned downstream of the fixing roller 37 in the sheet conveying path of the image forming portion 3 so as to be elongated along the main scanning direction. The cross-flow fan 72 is rotated by power transmitted from the driving portion 71, to be able to blow air over a wide range in the main scanning direction.

The plurality of the impellers 74 are each a fan that takes in air from a direction perpendicular to the axial direction, and blows air in a direction perpendicular to the axial direction. For example, the impellers 74 are integrally formed of resin.

In the cross-flow fan 72, an air blowing range in the main scanning direction is expanded by the plurality of the impellers 74 being connected to each other in the axial direction, as shown in FIG. 3. Thus, by the cross-flow fan 72 being formed of the plurality of the impellers 74, air can be blown over a wide range in the main scanning direction while strength of blades for blowing air is maintained. The number of the impellers 74 of the cross-flow fan 72 may be determined as appropriate in consideration of an air blowing range in the main scanning direction.

Specifically, the impeller 74 is formed into a cylindrical shape, having a bottom, in which a first end portion 742 on the right side in the left-right direction is a bottom portion and a second end portion 744 on the left side in the left-right direction is an open end portion as shown in FIG. 4 and FIG.

5. The first end portion 742 is formed into a disk shape, and has an opening 741 and a plurality of projections 743, as shown in FIG. 4. The second end portion 744 is formed into an annular shape and has a plurality of recesses 745, as shown in FIG. 5. As shown in FIG. 4 and FIG. 5, a blade portion 746 is provided between the first end portion 742 and the second end portion 744.

The opening 741 is an opening that is formed, in the first end portion 742, at a position corresponding to the axial center of the impeller 74, as shown in FIG. 4. The opening 741 is formed such that the shaft 73 can be inserted therein. Thus, movement of each impeller 74 in the direction perpendicular to the axial direction during rotation of the cross-flow fan 72 is regulated by the shaft 73.

In the impellers 74, the outer circumferential surface of the first end portion 742 and the inner circumferential surface of the second end portion 744 are formed so as to be fittable into each other in the axial direction. Thus, movement of each impeller 74 in the direction perpendicular to the axial direction during rotation of the cross-flow fan 72 is regulated also by the adjacent impeller 74. That is, in the cross-flow fan 72, movement of each impeller 74 in the direction perpendicular to the axial direction during rotation of the cross-flow fan 72 is regulated by combination of insertion of the shaft 73 into the opening 741 with fitting of the outer circumferential surface of the first end portion 742 and the inner circumferential surface of the second end portion 744 into each other. In another embodiment, the outer circumferential surface of the first end portion 742 may not be fitted into the inner circumferential surface of the second end portion 744.

The projections 743 are formed on the outer circumferential surface of the first end portion 742, and project in the direction perpendicular to the axial direction. Specifically, the projections 743 are formed on the outer circumferential surface of the first end portion 742 at regular intervals along a direction in which the impeller 74 rotates, as shown in FIG. 4 and FIG. 6.

Meanwhile, the recesses 745 are formed in the inner circumferential surface of the second end portion 744, and are fittable onto the projections 743. Specifically, the recesses 745 are formed in the inner circumferential surface of the second end portion 744 at regular intervals along the direction in which the impeller 74 rotates, as shown in FIG. 5. Thus, the two impellers 74 connected to each other by the projections 743 and the recesses 745 being fitted into each other can integrally rotate. In the cross-flow fan 72, the plurality of the impellers 74 are connected in the axial direction so as to be integrally rotatable, by the projections 743 and the recesses 745 being fitted into each other. The projections 743 and the recesses 745 are examples of fitting portions of the present invention.

The blade portion 746 is long in the axial direction and has a plurality of blades arranged so as to be annular along the direction in which the impeller 74 rotates, as shown in FIG. 4 and FIG. 5.

In the impeller 74, as shown in FIG. 4 to FIG. 6, a plurality of the blades of the blade portion 746 extend parallel to the axial direction from the end surface of the second end portion 744 and connect with the outer circumferential surface of the first end portion 742. Further, as shown in FIG. 6, the projections 743 are each provided between the adjacent blades on the outer circumferential surface of the first end portion 742. Moreover, the projections 743 and the recesses 745 are provided so as to oppose each other in the axial direction. That is, the shape of the impeller 74 is formed such that a demolding direction of a mold used for forming the impeller 74 is only one direction. Thus, a process by a slide core need not be performed when the impeller 74 is molded by using a mold, and increase of production cost for the impeller 74 can be inhibited.

The fixing portion 75 can be fitted into the recesses 745 to fix the impeller 74 to the shaft 73. Specifically, the fixing portion 75 has a disk portion 751 and a shaft fixing portion 752 as shown in FIG. 7.

The disk portion 751 is formed so as to be fittable into the recesses 745 in the axial direction. Specifically, as shown in FIG. 8 and FIG. 9, the disk portion 751 has, on the right side portion, a projection 753 formed so as to be fittable into the inner circumferential surface of the second end portion 744 of the impeller 74, and projections 754 are formed on the outer circumferential surface of the projection 753 so as to be fittable into the recesses 745. Thus, the shape of the second end portion 744 of the impeller 74 can be utilized to fix the impeller 74 to the shaft 73, and the shape of the impeller 74 positioned at the end portion, in the axial direction, of the cross-flow fan 72 need not be changed to a shape that is proper for fixing to the shaft.

The shaft fixing portion 752 is provided so as to project on both sides, in the axial direction, of the disk portion 751, as shown in FIG. 7 and FIG. 9. Specifically, the shaft fixing portion 752 is formed of an elastic member such as rubber, and is pressed into and fixed in an opening formed at the center of the circular shape of the disk portion 751. An opening 756 into which the end portion 731 of the shaft 73 is inserted, is formed at the end portion, on the right side in the left-right direction, of the shaft fixing portion 752, and the shaft 73 is pressed into and fixed in the opening 756. Meanwhile, an opening 755 into which the drive shaft 71A is inserted, is formed at the end portion, on the left side in the left-right direction, of the shaft fixing portion 752, and the drive shaft 71A is pressed into and fixed in the opening 755. That is, in the cross-flow fan 72, the fixing portion 75 allows the impeller 74 to be fixed to the shaft 73 and the drive shaft 71A and the shaft 73 to be connected. Thus, a mechanism for connecting the shaft 73 and the drive shaft 71A need not be separately provided in the axial direction, and components of the cooling portion 7 can be simplified and a space in the axial direction can be saved.

The locking portion 76 can be mounted to the shaft 73, and locks movement of the impeller 74 in the axial direction. For example, the locking portion 76 is implemented as a C ring that can be mounted to the shaft 73. The locking portion 76 is provided on the end portion, on the right side in the left-right direction, of the cross-flow fan 72 as shown in FIG. 3 and FIG. 10, and locks rightward movement of each impeller 74. Thus, movement, in the axial direction, of each of the plurality of the impellers 74 connected to each other in the axial direction is regulated between the fixing portion 75 and the locking portion 76. The fixing portion 75 and the locking portion 76 represent an example of a regulation portion of the present invention.

Meanwhile, the bearing portion 77 supports the end portion 732 of the shaft 73 rotatably. Specifically, the bearing portion 77 has: a bearing 771 provided on the second side portion, in the main scanning direction, of the housing of the image forming apparatus 10; a shaft support member 772 supported by the bearing 771 so as to be rotatable; and an elastic member 773 pressed into the shaft support member 772, as shown in FIG. 10. The end portion 732 of the shaft 73 is pressed into the elastic member 773, whereby the end portion 732 of the shaft 73 is supported by the bearing 771 so as to be rotatable.

As described above, in the cross-flow fan 72 used for cooling in the image forming apparatus 10, the shaft 73 is fitted into the opening 741 for connection, whereby movement of each impeller 74 in the direction perpendicular to the axial direction is regulated. Further, the projections 743 and the recesses 745 are fitted into each other for connection, whereby the impellers 74 can integrally rotate. Further, movement of each impeller 74 in the axial direction is regulated by the fixing portion 75 and the locking portion 76. Therefore, in the cross-flow fan 72, each impeller 74 need not be fixed to the shaft 73, whereby increase of time for an assembling process can be inhibited.

The invention claimed is:

1. A cross-flow fan comprising:

a shaft;

a plurality of impellers each having an opening into which the shaft is inserted, the plurality of impellers each having fitting portions provided at a disk shaped first end portion and an annular shaped second end portion, in an axial direction of the shaft such that, in the plurality of impellers, the fitting portions at the first end portion of one of the plurality of impellers and the fitting portions at the second end portion of an adjacent one of the plurality of impellers are fittable into each other, the plurality of impellers each having a blade portion provided between the first end portion and the second end portion; and a regulation portion configured to regulate movement, in the axial direction, of each of the plurality of impellers that are integrally rotatable and connected in the axial direction by the shaft which is inserted into the opening of each of the plurality of impellers and the fitting portions being provided, the regulation portion regulating the movement of the plurality of impellers on both ends, in the axial direction, of each of the plurality of impellers, wherein the regulation portion includes a fixing portion configured to be fittable into the fitting portions at the second end portion and configured to fix each of the plurality of impellers to the shaft, the fitting portions at the first end portion are a plurality of projections that are formed on an outer circumferential surface of the first end portion at regular intervals along a direction in which the plurality of impellers rotate, and project in a direction perpendicular to the axial direction, the fitting portions at the second end portion are a plurality of recesses that are formed in an inner circumferential surface of the second end portion at regular intervals along the direction in which the plurality of impellers rotate, and each of the recesses fitted onto a respective one of the plurality of projections, each of the plurality of impellers has a cylindrical shape, having a bottom, in which the first end portion is a bottom portion, and the second end portion is an open end portion, the outer circumferential surface of the first end portion of the one of the plurality of impellers and the inner circumferential surface of the second end portion of the adjacent one of the plurality of impellers are fittable into each other in the axial direction, the opening of each of the plurality of impellers is formed in the first end portion, the blade portion includes a plurality of blades that extend parallel to the axial direction from an end surface of the second end portion, and connect with the outer circumferential surface of the first end portion, each of the recesses and the respective one of the plurality of projections are provided so as to oppose each other in the axial direction, the shaft is inserted into all of the plurality of impellers, a shape of each of the plurality of impellers is formed such that a demolding direction of a mold used for forming each of the plurality of impellers is in only one direction, and the fixing portion includes:

a disk portion having a projection portion on which a plurality of fitting projections configured to be fitted with the plurality of recesses of an end one of the plurality of impellers are formed such that the projection portion is fittable into the inner circumferential surface of the second end portion of the end one of the plurality of impellers; and a shaft fixing portion which is an elastic member that is pressed into and fixed in a disk opening formed at a center of a circular shape of the disk portion, a first opening and a second opening being formed in the shaft fixing portion, wherein an end portion of the shaft is pressed into and fixed in the first opening, and a drive shaft is pressed into and fixed in the second opening.

2. The cross-flow fan according to claim 1, wherein the regulation portion further includes:

a locking portion configured to be able to be mounted to the shaft and lock movement of each of the plurality of impellers in the axial direction.

* * * * *